(12) United States Patent
Kim et al.

(10) Patent No.: US 7,501,756 B2
(45) Date of Patent: Mar. 10, 2009

(54) ORGANIC LIGHT EMITTING DISPLAY

(75) Inventors: Mu-Hyun Kim, Suwon-si (KR);
Myung-Won Song, Suwon-si (KR);
Tae-Min Kang, Suwon-si (KR);
Seong-Taek Lee, Suwon-si (KR);
Yu-Sung Cho, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 479 days.

(21) Appl. No.: 10/944,748

(22) Filed: Sep. 21, 2004

(65) Prior Publication Data
US 2005/0116631 A1 Jun. 2, 2005

(30) Foreign Application Priority Data
Nov. 29, 2003 (KR) .................... 10-2003-0087789

(51) Int. Cl.
*H01J 63/04* (2006.01)
(52) U.S. Cl. ...................... 313/506; 313/512
(58) Field of Classification Search ......... 313/503–506, 313/509, 512
See application file for complete search history.

(56) References Cited

U.S. PATENT DOCUMENTS

| 6,246,179 | B1 | 6/2001 | Yamada |
| 6,727,871 | B1 * | 4/2004 | Suzuki et al. .............. 345/76 |
| 2002/0063515 | A1 | 5/2002 | Goto |
| 2003/0038594 | A1 | 2/2003 | Seo et al. |
| 2003/0151358 | A1 | 8/2003 | Iga |
| 2003/0209976 | A1 | 11/2003 | Abe |

FOREIGN PATENT DOCUMENTS

| CN | 1423513 | 6/2003 |
| EP | 0717445 | 6/1996 |
| EP | 1063704 | 12/2000 |
| EP | 1315209 | 5/2003 |

(Continued)

OTHER PUBLICATIONS

"*Transparent Stacked Organic Light Emitting Devices. II. Device Performance and Applications to Displays*" by Gu et al., Journal of Applied Physics, vol. 86, No. 8, Oct. 15, 1999, pp. 4076-4084.

(Continued)

*Primary Examiner*—Toan Ton
*Assistant Examiner*—Hana A Sanei
(74) *Attorney, Agent, or Firm*—Robert E. Bushnell, Esq.

(57) ABSTRACT

An organic light emitting display which is constructed with a TFT substrate having an insulating substrate and a TFT that has at least a source electrode and a drain electrode, a lower electrode formed on the TFT substrate and connected to one of source/drain electrodes, an insulating layer having an opening that exposes a portion of the lower electrode, an organic thin film layer formed on the exposed portion of the lower electrode and the insulating layer, and an upper electrode formed on the organic thin film layer, wherein the insulating layer has a taper angle less than 40° at an edge of the opening, and a step less than or equal to 3,000 Å is formed between the lower electrode and the organic thin film layer. The organic light emitting display can prevent device failure.

5 Claims, 12 Drawing Sheets

FOREIGN PATENT DOCUMENTS

| | | | |
|---|---|---|---|
| JP | 2001-110575 | | 4/2001 |
| JP | 2001110575 A | * | 4/2001 |
| JP | 2003-168569 | | 6/2003 |

OTHER PUBLICATIONS

Japanese Office action corresponding to Japanese Patent Application No. 2004-344945, issued on Feb. 20, 2007.

Japanese Office action corresponding to Japanese Patent Application No. JP2004-344945, issued on Jun. 19, 2007.

Office action from the Chinese Patent Office issued in Applicant's corresponding Chinese Patent Application No. 200410089749.4 dated Aug. 31, 2007.

Search Report from European Patent Office issued in Applicant's corresponding European Patent Application No. 08151027.3 dated May 26, 2008.

* cited by examiner

ORGANIC LIGHT EMITTING DISPLAY

CLAIM OF PRIORITY

This application makes reference to, incorporates the same herein, and claims all benefits accruing under 35 U.S.C. §119 from an application for ORGANIC LIGHT EMITTING DISPLAY earlier filed in the Korean Intellectual Property Office on 29 Nov. 2003 and there duly assigned Serial No. 2003-87789.

BACKGROUND OF THE INVENTION

1. Field of the Invention

The present invention relates to an organic light emitting display and, more particularly, to a full color active matrix organic light emitting display that can reduce a step height between an organic thin film layer and a lower electrode and relieve a taper angle of a substrate surface to prevent device failure from occurring.

2. Description of the Related Art

Generally, an active matrix organic light emitting display (AMOLED) has a structure such that a thin film transistor (TFT) is arranged on a substrate in a form of a matrix, an anode connected to the TFT is formed, and an organic thin film layer and a cathode are formed thereon.

FIG. 1 is a cross-sectional view of a conventional bottom-emission organic light emitting display. Referring to FIG. 1, a buffer layer 105 is formed on an insulating substrate 100, and a semiconductor layer 110 including source/drain regions 111, 115 is formed on the buffer layer 105. A gate electrode 125 is formed on a gate insulating layer 120, and source/drain electrodes 141, 145 each connected to the source/drain regions 111, 115 through first holes 131, 135 are formed in an interlayer insulating layer 130.

An anode 170, a lower electrode connected to the drain electrode 145 of the source/drain electrode 141, 145 through a second hole 155, is formed on a passivation layer 150 and the drain electrode portion at the second hole 155, and an organic thin film layer 185 and a cathode 190, which is an upper electrode, are formed thereon.

In the conventional organic light emitting diode having the above structure, when a taper angle of the first hole or the second hole is large, there occurred a pinhole defect at the stepped region between around the second hole or the first hole and the anode 170, and a short defect of the anode and the cathode. Further, since the organic emission layer is not uniformly deposited around the first hole and the second hole and at the stepped region of the anode, there were problems that a dark spot was generated by a concentrated phenomenon of current density when a voltage between the anode and the cathode was applied, and that an emission region was reduced due to the generation of the dark spot to degrade picture quality.

To address the foregoing problems, an organic light emitting display employing a pixel defining layer made of the organic insulating layer with a planarization feature was disclosed in U.S. Pat. No. 6,246,179.

FIG. 2 is a cross-sectional view of a conventional organic light emitting diode having a pixel defining layer. Referring to FIG. 2, a buffer layer 205 is formed on an insulating substrate 200, and a semiconductor layer 210 including source/drain regions 211, 215 is formed on the buffer layer 205. A gate electrode 225 is formed on a gate insulating layer 220, and source/drain electrodes 241, 245 connected to the source/drain regions 211, 215 through first holes 231, 235 are formed in an interlayer insulating layer 230.

An anode 270, which is a lower electrode connected to one of the source/drain electrodes 241, 245, e.g. the drain electrode 245, through a second hole 255, is formed on a passivation layer 250 and the drain electrode portion at the second hole 255. A pixel defining layer 265 including an opening 275 that exposes a portion of the anode 270 is formed, and an organic thin film layer (i.e., organic emission layer) 285 and a cathode 290, which is an upper electrode, are formed on the exposed portion of the anode 270 and the pixel defining layer 265. The organic thin film layer 285 has at least one organic emission layer such as a hole injection layer, a hole transporting layer, an emitting layer of R, G or B, a hole blocking layer, an electron transports layer and an electron injection layer.

The conventional top-emission organic light emitting display as described above solved the problem of the device defect caused by the stepped region of the substrate surface by using the pixel defining layer 265. However, when the organic emission layer is formed by the laser induced thermal imaging process, device reliability is changed depending on the taper angle and the step between the pixel defining layer 265 and the anode 270.

FIGS. 3A to 3C are cross-sectional views for illustrating a method of forming an organic emission layer using the laser induced thermal imaging process.

Referring to FIG. 3A, a TFT including the semiconductor layer 210, the gate electrode 225 and the source/drain electrodes 241, 245 is formed on the insulating substrate 200, and the anode 270 connected to the drain electrode 245 of the source/drain electrodes 241, 245 through the second hole 255 arranged in the passivation layer 250 is formed, as shown in FIG. 2. The pixel defining layer 265 having an opening 275 to expose a portion of the anode 270 is formed. A donor film 20 having an organic emission layer 21 is aligned and closely adheres to the substrate on which the TFT is formed (TFT substrate).

Next, as shown in FIG. 3B, while the donor film 20 adheres to the TFT substrate, a laser is irradiated with a pattern onto a predetermined region. When the laser is irradiated on the donor film 20, a portion of film where the laser is irradiated is expanded and the organic emission layer 21 of the donor film 20 is patterned on the insulating substrate 200. When the donor film 20 is removed from the TFT substrate after completing a transfer process, an organic emission layer pattern 285a is formed on the anode 270 and the sidewall of the pixel defining layer 265, as shown in FIG. 3C.

When the organic emission layer pattern 285a is formed by the laser induced thermal imaging process, a distance h31 from the surface of the organic emission layer 21 to the upper surface of the anode 270 has a close relationship to the energy required during the laser induced thermal imaging process. That is, when the pixel defining layer 265 is deposited thick so that there is a high step between the pixel defining layer 265 and the anode 270, the distance h31 to which the donor film 20 should reach the opening 275 should be relatively increased. Further, to this end, the donor film 20 should be expanded relatively large, so that the irradiation energy of the laser should be increased.

As the irradiation energy becomes large, the surface temperature of the donor film 20 is also increased to the extent more than required, so that the characteristics of the organic emission layer pattern 285a transferred to the anode 270 and the pixel defining layer 265 are changed. When the characteristics of the emission layer are changed, there were problems of characteristic deterioration, such as the deterioration of the efficiency of the resultant organic light emitting display, a change in the color coordinate, and reduction of the life-time.

Further, when the organic emission layer is formed by the laser induced thermal imaging process, the donor film and the TFT substrate should adhere tightly with each other. However, when the taper angle of the pixel defining layer 265 is large, the donor film does not adhere tightly to the insulating substrate at the edge, so that there occurs an open defect 285c, or the organic emission layer pattern 285a within the opening 275 is open. Particularly, the donor film does not adhere tightly to the TFT substrate at the edge of the opening 275, so that the open defect 285c is generated at the edge of the opening 275. That is, when the organic emission layer is not rightly transferred or even when it is regularly transferred, a defect such as unclean transfer boundary is generated.

FIG. 6 is a picture showing an edge open defect of the conventional organic light emitting display having a pixel defining layer with a large taper angle and a high step. Referring to FIG. 6, it shows that when the pixel defining layer is formed at a taper angle of more than 40° and in a step height of 10,000 Å, the edge open defect is generated at the opening, which is a boundary between the anode and the pixel defining layer. During the laser transfer process, the characteristics of the organic emission layer are changed by the high energy required due to the high step of the pixel defining layer, so that the efficiency of the organic emission layer is degraded to less than 30%. In this case, for the blue organic emission layer, the color coordinate was changed from 0.15, 0.18 to 0.17, 0.25 along with the efficiency reduction, and for the red organic emission layer, a mixed color phenomenon occurs due to the emission of the electron transporting layer at the portion where the edge open defect is generated.

SUMMARY OF THE INVENTION

It is, therefore, an object of the present invention to provide an improved organic light emitting display.

It is also an object of the present invention to provide an organic light emitting display that has a structure with a reduced step height and a reduced taper angle of a pixel defining layer to prevent device failure from occurring in an organic emission layer.

It is another object of the present invention to provide an organic light emitting display to which the laser induced thermal imaging process can be applied.

To achieve the above and other objects, an organic light emitting diode may be constructed with: a TFT substrate comprising an insulating substrate and a thin film transistor (TFT) formed on the insulating substrate and having at least a source electrode and a drain electrode; a lower electrode formed on the TFT substrate and connected to one of the source electrode and the drain electrode; an insulating layer having an opening that exposes a portion of the lower electrode; an organic thin film layer formed on the exposed portion of the lower electrode and the insulating layer; and a upper electrode formed on the organic thin film layer, wherein the insulating layer has a taper angle of not greater than 40° at an edge of the opening, and a step height between the upper surface of the lower electrode at the opening and the bottom surface of the organic thin film layer formed on the insulating layer is less than or equal to about 3,000 Å.

The insulating layer is a pixel defining layer. The organic thin film layer includes at least one organic layer selected from a hole injection layer, a hole transporting layer, an emitting layer, a hole blocking layer, an electron transporting layer and an electron injection layer, and the organic thin film layer is formed by a laser induced thermal imaging process.

The lower electrode is one of an anode and a cathode, and the upper electrode is the other one. When the lower electrode is a transparent electrode, and the upper electrode is a reflective electrode, light emitted from the organic thin film layer is emitted in the direction of the TFT substrate. When the lower electrode is a reflective electrode and the upper electrode is a transparent electrode, light emitted from the organic thin film layer is emitted in the direction opposite to the TFT substrate. When the lower electrode is a transparent electrode and the upper electrode is a transparent electrode, a light emitted from the organic thin film layer is emitted in both the direction of the TFT substrate and the direction opposite to the TFT substrate.

Further, the present invention provides an organic light emitting display comprising: a TFT substrate comprising an insulating substrate and a TFT formed on the insulating substrate, the TFT having at least a source electrode and a drain electrode; a first insulating layer and a second insulating layer formed on the insulating substrate and having a hole that exposes one of the source electrode and the drain electrode; a lower electrode formed on the second insulating layer and connected to the one of the source electrode and the drain electrode through the hole; a third insulating layer having an opening that exposes a portion of the lower electrode; an organic thin film layer formed on the exposed portion of the lower electrode and the third insulating layer; and a upper electrode formed on the organic thin film layer, wherein the third insulating layer has a taper angle of not greater than 40° at an edge of the opening, and a step height between the upper surface of the lower electrode at the opening and the bottom surface of the organic thin film layer formed on the third insulating layer is less than or equal to about 3,000 Å.

Further, the present invention provides an organic light emitting display comprising: a TFT substrate comprising an insulating substrate and a TFT formed on the insulating substrate and having at least a source electrode and a drain electrode; a first insulating layer formed on the TFT substrate and having a hole that exposes one of the source electrode and the drain electrode; a lower electrode formed on the first insulating layer and connected to the one of the source electrode and the drain electrode through the hole; a second insulating layer having an opening that exposes a portion of the lower electrode an organic thin film layer formed on the exposed portion of the lower electrode and the second insulating layer; and a upper electrode formed on the organic thin film layer, wherein the second insulating layer has a taper angle of not greater than 40° at an edge of the opening, and a step height between the upper surface of the lower electrode at the opening and the bottom surface of the organic thin film layer formed on the second insulating layer is less than or equal to about 3,000 Å.

Further, the present invention provides an organic light emitting display comprising: a TFT substrate comprising an insulating substrate and a TFT formed on the insulating substrate, the TFT having at least a source electrode and a drain electrode; an insulating layer formed on the TFT substrate and having a hole that exposes one of the source electrode and the drain electrode; a lower electrode formed on the first insulating layer and connected to the one electrode through the hole; an organic thin film layer formed at least on the lower electrode; and a upper electrode formed on the organic thin film layer, wherein the lower electrode has a taper angle of not greater than 40° at an edge of the lower electrode, and the organic thin film layer includes an organic emission layer formed by a laser induced thermal imaging process.

Further, the present invention provides an organic light emitting display comprising: a TFT substrate comprising an insulating substrate a semiconductor layer having a source region and a drain region, a first insulating layer having holes that expose a portion of the source/drain regions and a TFT having source/drain electrodes connected to the source/drain regions through the holes; a lower electrode formed on the first insulating layer and connected to one of the source/drain electrodes; a second insulating layer having a first opening that exposes a first portion of the lower electrode; a third insulating layer having a second opening that exposes a second portion of the lower electrode which is within the first portion of the lower electrode; an organic thin film layer formed on the third insulating layer and the second portion of the lower electrode; and a upper electrode formed on the organic thin film layer, wherein the third insulating layer has a taper angle of not greater than 40° at an edge of the second opening, and wherein a step height between the upper surface of the lower electrode and the bottom surface of the organic thin film layer formed on the third insulating layer is less than or equal to about 3,000 Å.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
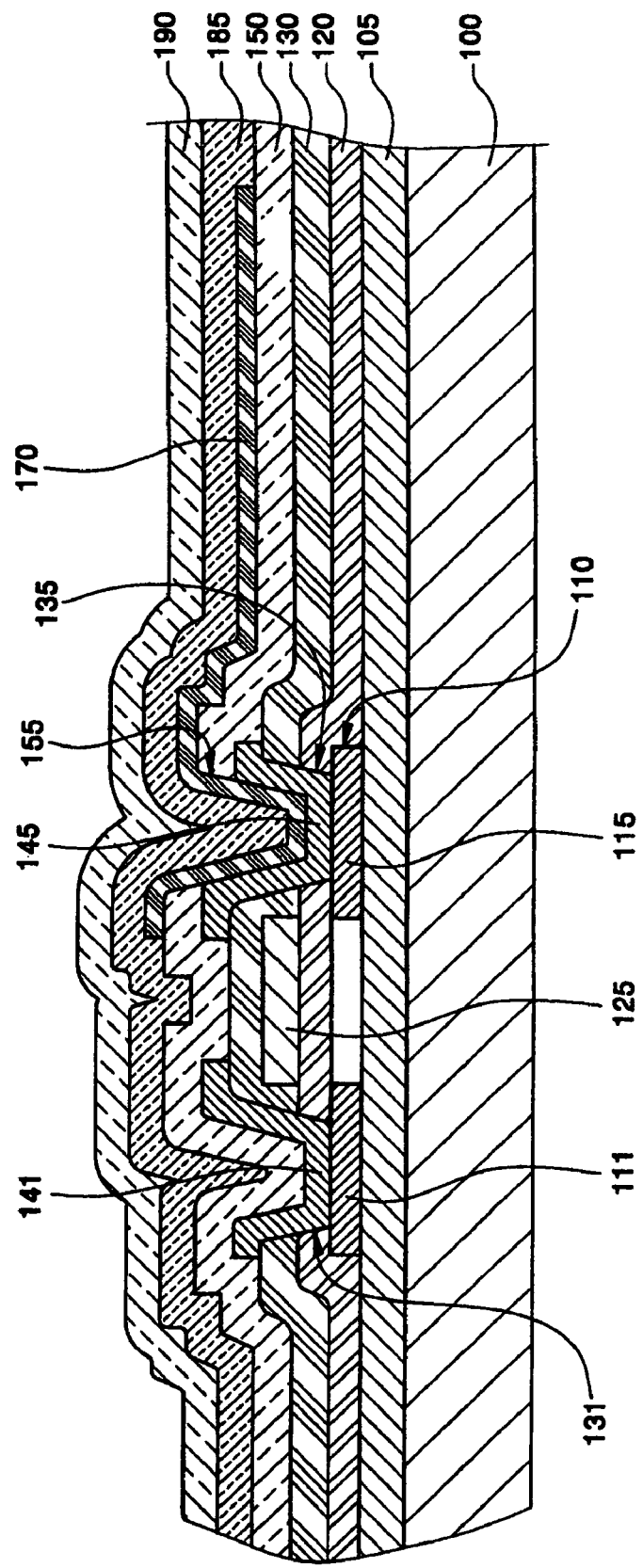
FIG. 1 is a cross-sectional view of a conventional organic light emitting display.
Figure 2:
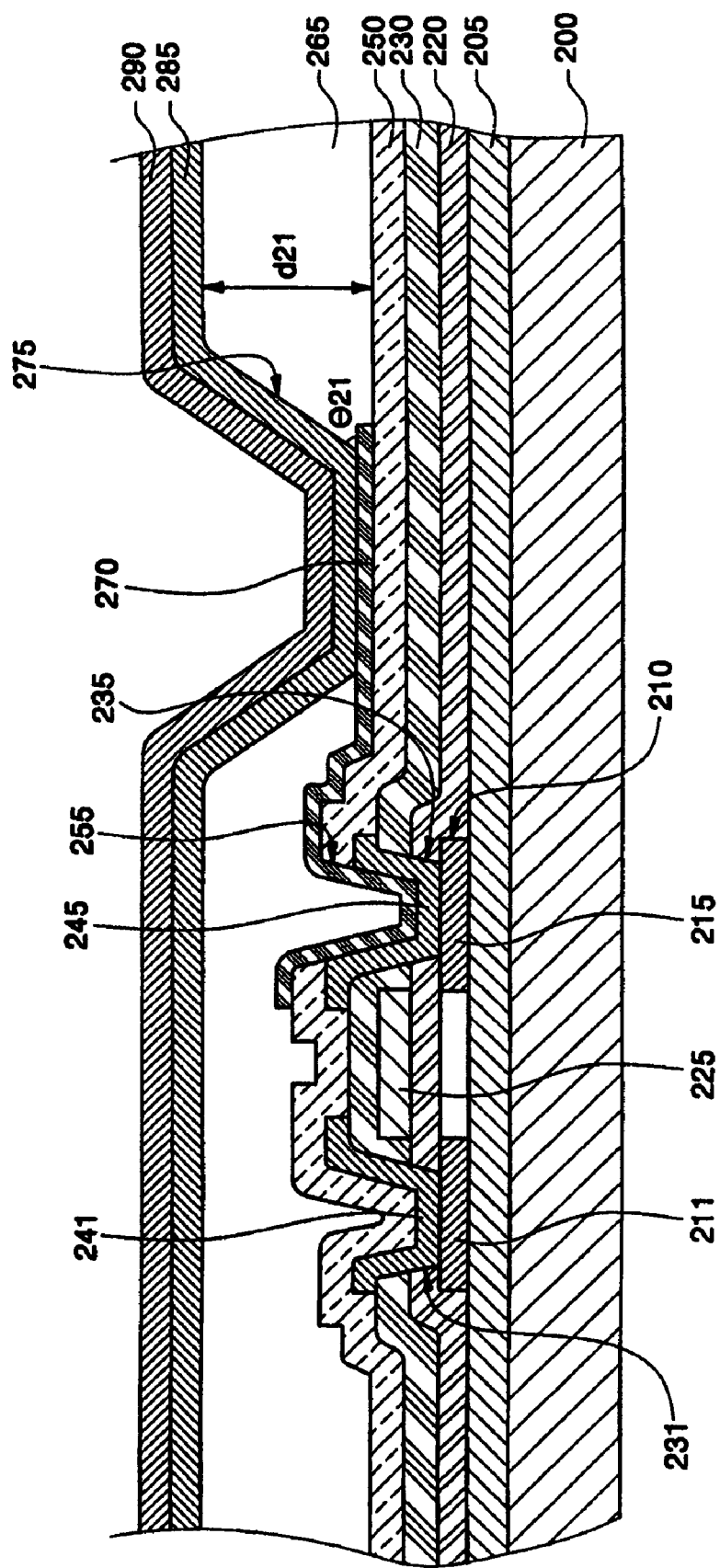
FIG. 2 is a cross-sectional view of a conventional organic light emitting display having a pixel defining layer.
Figure 3A:
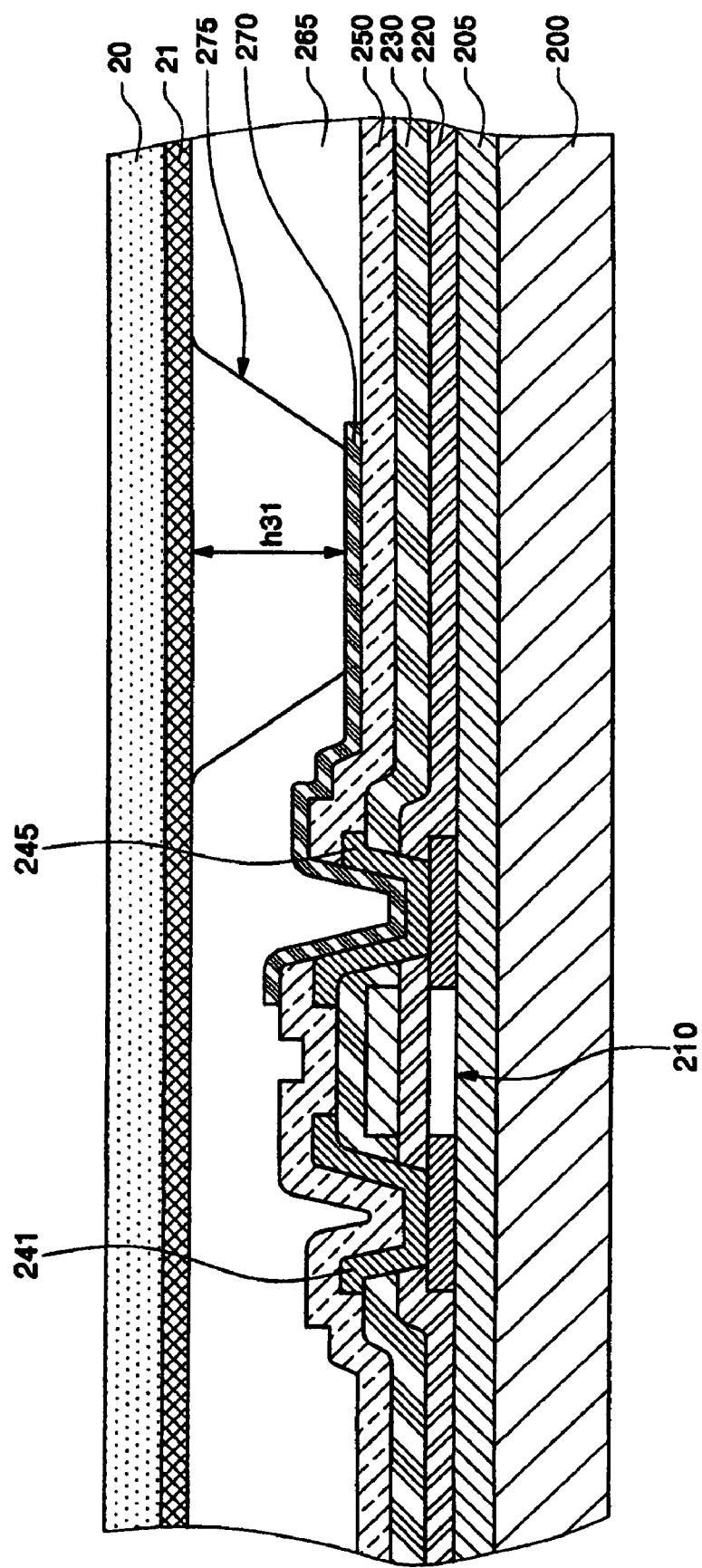
FIGS. 3A TO 3C are cross-sectional views for illustrating a method of forming an organic emission layer using a laser induced thermal imaging process, for a conventional organic light emitting display having a pixel defining layer.
Figure 3B:
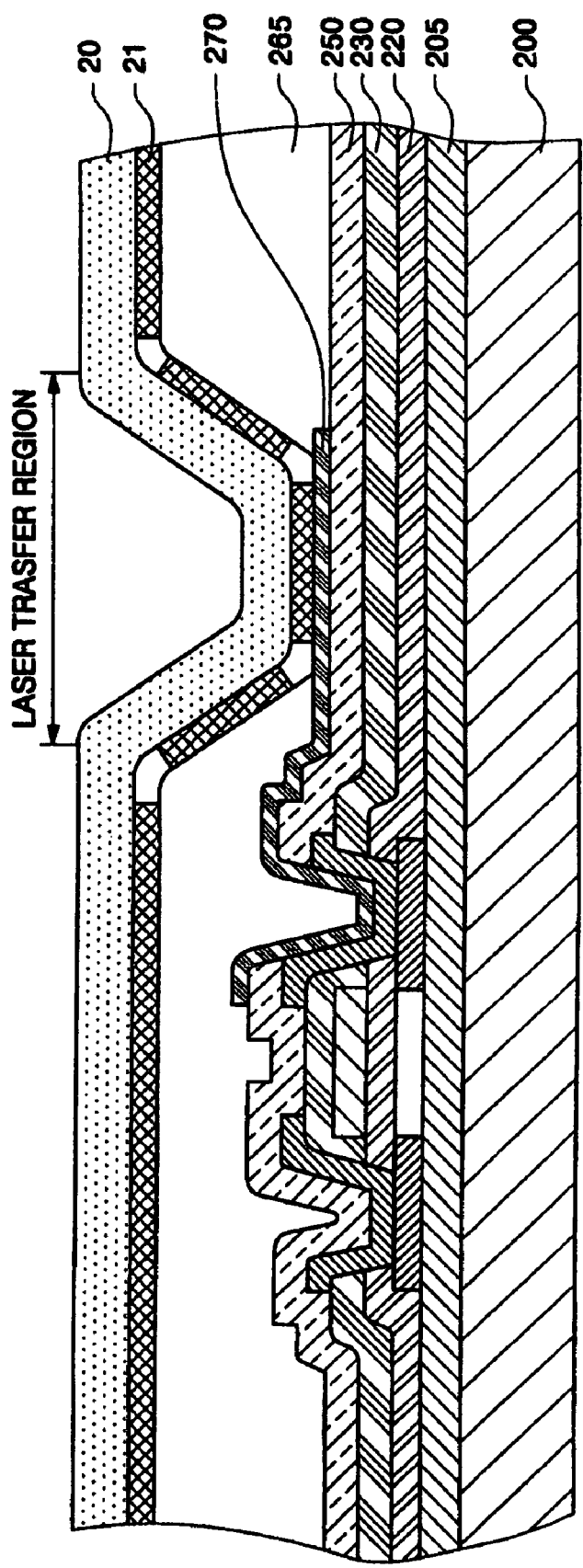
Figure 3C:
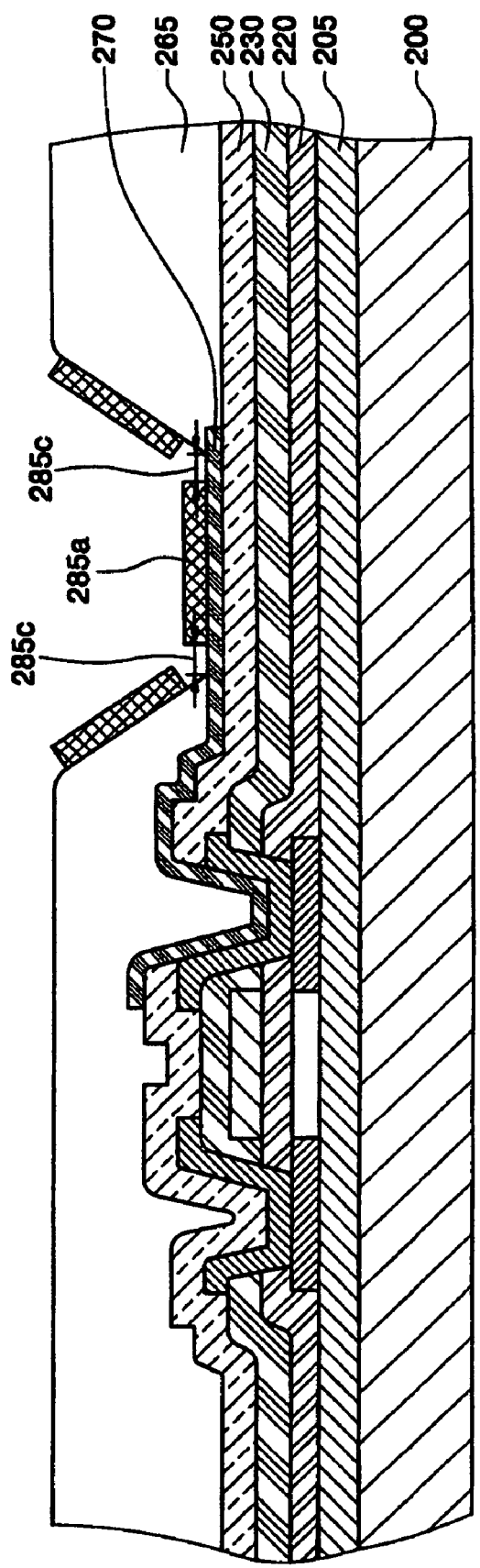

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and areas are exaggerated for clarity. Like numbers refer to like elements throughout the specification.

Figure 7:
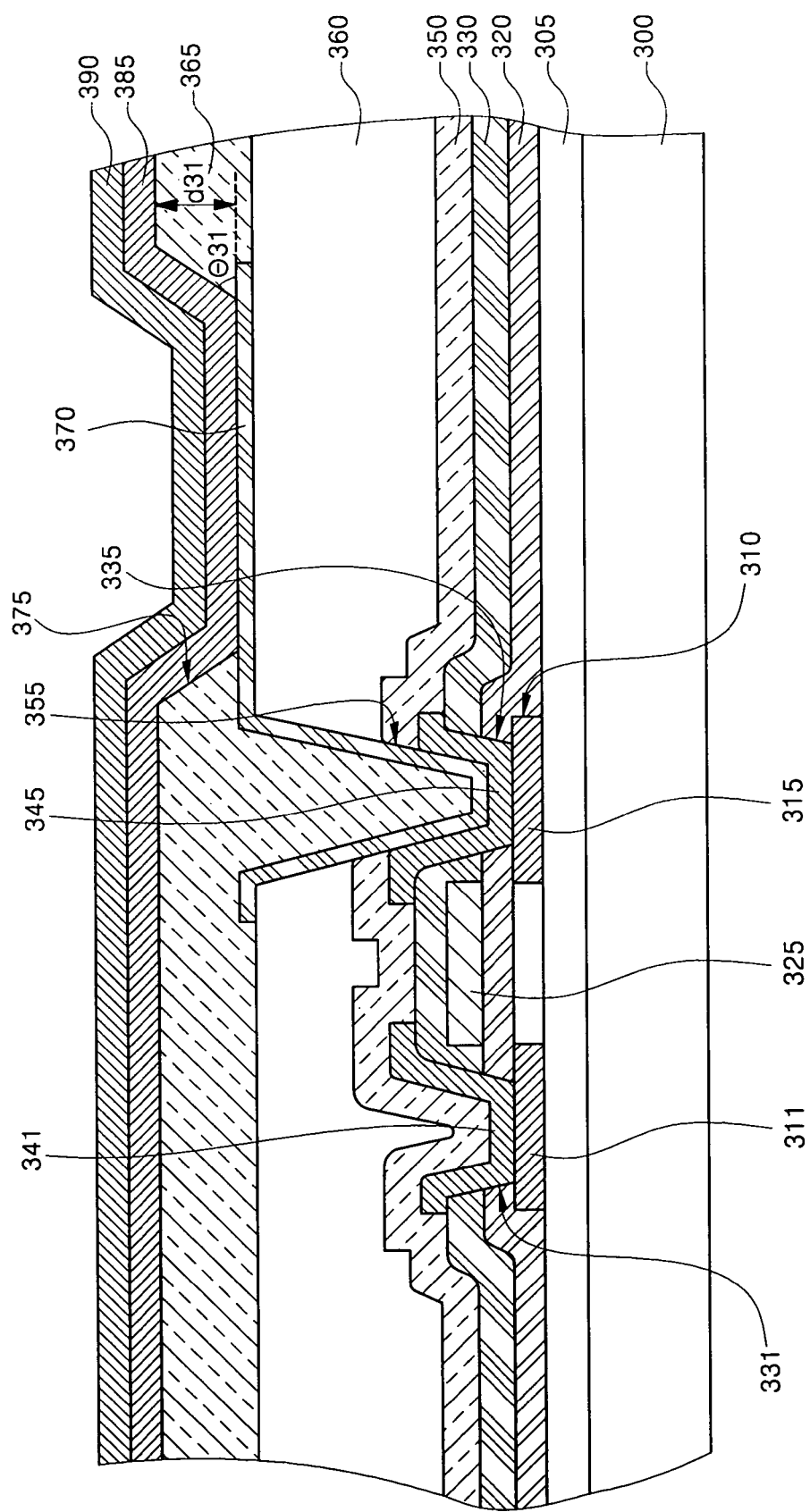
FIG. 7 is a cross-sectional view of an organic light emitting display according to a first embodiment of the present invention.

FIG. 7 is a cross-sectional view of a top-emission organic light emitting display according to a first embodiment of the present invention. Referring to FIG. 7, a buffer layer 305 is formed on an insulating substrate 300, and a semiconductor layer 310 having source/drain regions 311, 315 is formed on the buffer layer 305. A gate electrode 325 is formed on a gate insulating layer 320, and source/drain electrodes 341, 345 connected to the source/drain regions 311, 315 through first holes 331, 335 are formed in an interlayer insulating layer 330.

A planarization layer 360 is formed on a passivation layer 350, and an anode 370, which is a lower electrode connected to one of the source/drain electrodes 341, 345, for example, the drain electrode 345, through a second hole 355, is formed in the planarization layer 360. A pixel defining layer 365 including an opening 375 that exposes a portion of the anode 370 is formed on the planarization layer, and an organic thin film layer 385 and a cathode 390 are sequentially formed on the TFT substrate. The organic thin film layer 385 includes at least an emission layer selected from a hole injection layer, a hole transporting layer, R, G or B emitting layer, a hole blocking layer, an electron transporting layer and an electron injection layer. The organic thin film layer includes an organic emission layer formed by the laser induced thermal imaging process.

According to the embodiment of the present invention, in order to prevent the edge open defect at the opening edge of the pixel defining layer and to prevent characteristic deterioration of the emission layer due to high energy in forming the organic emission layer using the laser induced thermal imaging process, it is desirable that a taper angle θ31 of the pixel defining layer 365 is not greater than 40° and that a step height d31, as shown in FIG. 7, from the upper surface of the anode 370, the lower electrode, to the upper surface of the pixel defining layer 365 is below or equal to about 3,000 Å.

Figure 4:
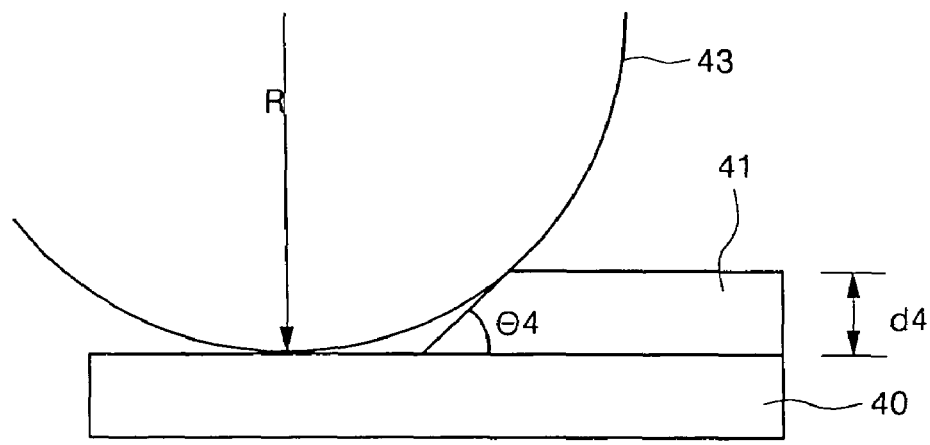
FIG. 4 is a graph for illustrating a relationship between a radius of curvature made by a donor film which does not completely adhere to the opening and an open edge defect, for an organic light emitting display.
Figure 5:
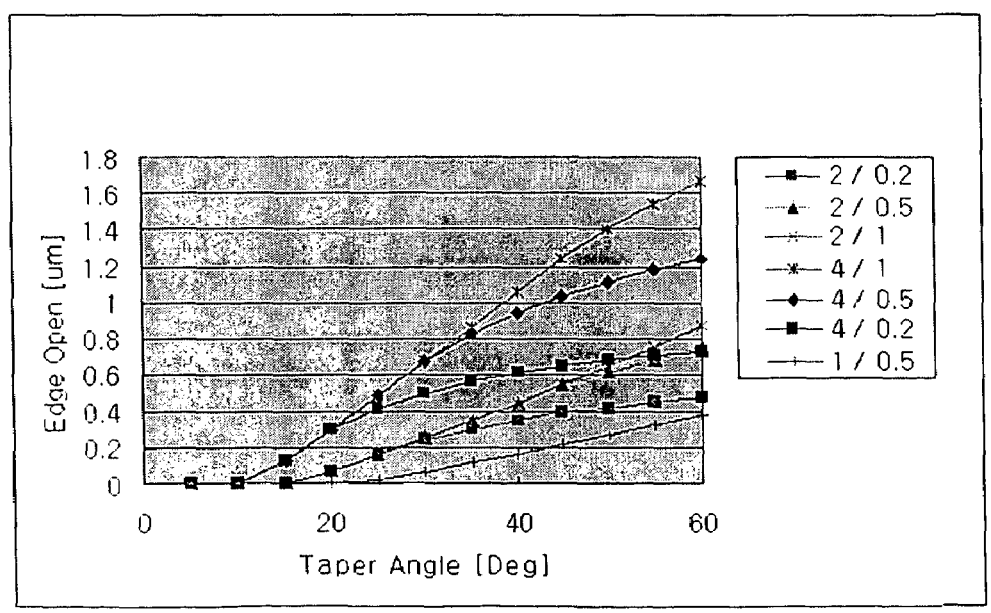
FIG. 5 is a diagram for illustrating a relationship between an open edge defect and a taper angle of a pixel defining layer for an organic light emitting display.
Figure 6:
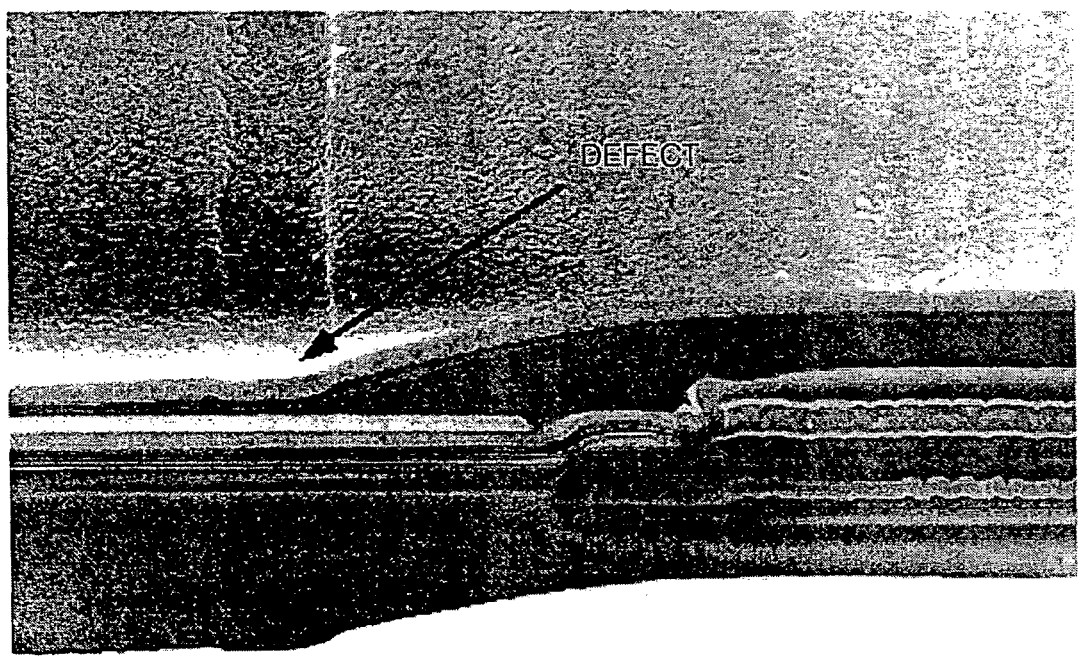
FIG. 6 is a picture showing an open edge defect generated when a pixel defining layer has a high step and a large taper angle for a conventional organic light emitting display.

FIG. 4 is a graph for illustrating a relationship between a radius of curvature of a donor film and an open edge defect, when an organic emission layer of an organic light emitting display is formed by the laser induced thermal imaging process as in the embodiment of the present invention, and FIG. 5 is a diagram for illustrating a relationship between an open edge defect and a taper angle of a pixel defining layer. In FIG. 5, each line indicates the edge open defect corresponding to the ratio of the curvature radius to the step.

Referring to FIGS. 4 and 5, a radius R is a radius of curvature 43 made by a donor film which does not completely adhere to the opening when the donor film is made adhere to the opening of the pixel defining layer 41 for laser transfer. The step height d4 is a distance from the upper surface of the anode 40, the lower electrode, to the upper surface of the pixel defining layer 41. Further, the edge open defect means that the edge portion of the opening, which the organic emission layer is not formed at or completely attached to, of the pixel defining layer 41.

Assuming that the donor film does adhere tightly to the TFT substrate at the opening of the pixel defining layer 41, that is, assuming that the donor film adheres tightly to the anode 40 and the pixel defining layer 41, the curvature radius R of the donor film becomes "0". Meanwhile, the lower the adhesion tightness to the TFT substrate is at the opening of the pixel defining layer 41, the larger the curvature radius R of the donor film becomes, whereas the higher the adhesion tightness to the TFT substrate is, the smaller the curvature radius R of the donor film becomes. Further, the adhesion tightness of the donor film to the TFT substrate is increased as the taper angle of the pixel defining layer 41 is low and the step is low. Accordingly, the curvature radius R of the donor film becomes small.

Therefore, it will be noticed that as the curvature radius of the donor film becomes smaller, the edge open defect of the organic emission layer is reduced. The organic emission layer is not formed in the region where the edge open defect is generated, so that there occurs characteristic deterioration such as a change of the color coordinate due to the color mixing.

Accordingly, to prevent this characteristic deterioration, the edge open defect should be reduced. The edge open defect needs to be at least below 1.0 µm for preventing the color mixing due to the edge open defect detected neither by naked eyes nor by the measuring device. For the edge open defect to be below 1.0 µm, it is desirable that the taper angle of the pixel defining layer is not greater than 40°. Further, from FIG. 5, It will be appreciated that as the curvature radius of the donor film and the step are smaller, the edge open defect is reduced.

Figure 11:
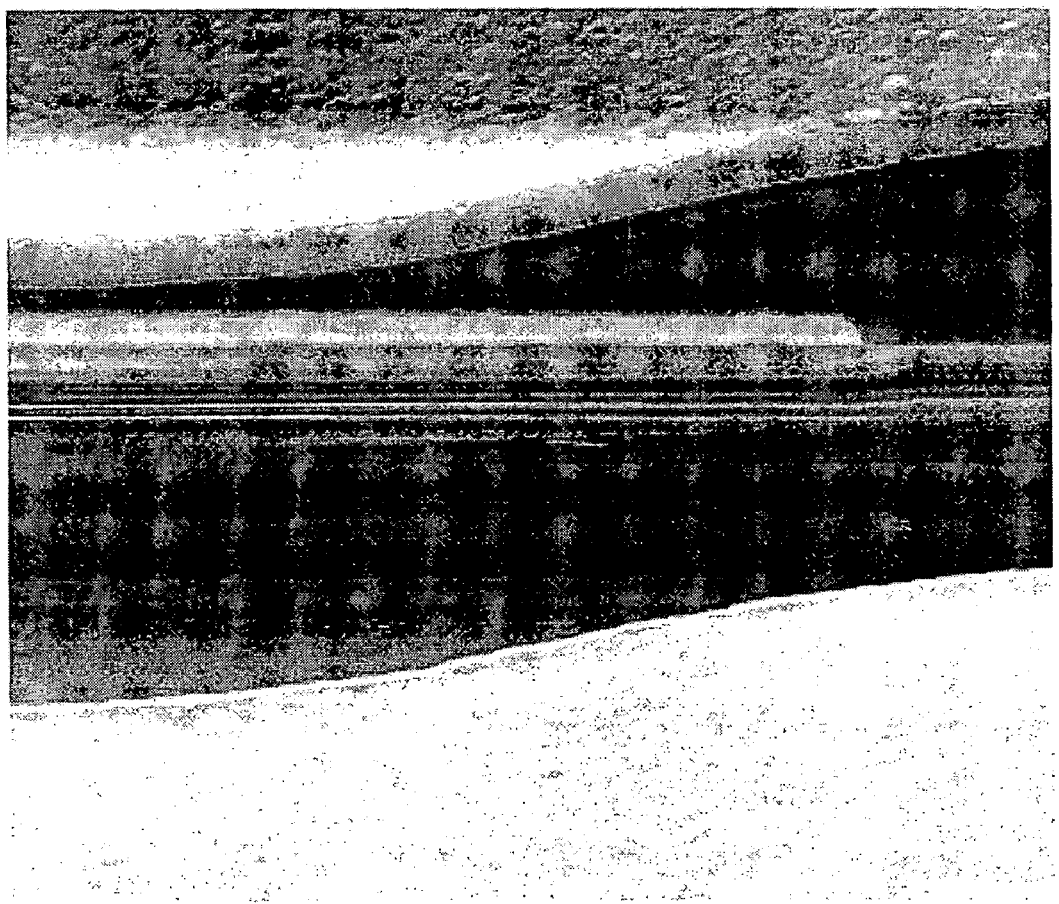
FIG. 11 is a picture showing that an open edge defect is not generated when a pixel defining layer has a low taper angle and a low step, for an organic light emitting display according to the embodiment of the present invention.

FIG. 11 is a picture showing a cross-sectional structure of an organic light emitting display in which the organic emission layer is formed by the laser induced thermal imaging process according to a first embodiment of the present invention. Referring to FIG. 11, it shows that, when the pixel defining layer is formed such that its taper angle is not greater than 40° and the organic light emitting display is fabricated such that the step height between the anode and the pixel defining layer is below or equal to about 3,000 Å, the edge open defect is not generated while forming the organic emission layer using the laser induced thermal imaging process at the edge of the opening.

Table 1 shows characteristic data of the device fabricated by the laser induced thermal imaging process, based on the laser transfer conditions and the step between the pixel electrode and the pixel defining layer.

The organic light emitting displays used in Table 1 are red light emitting displays, which are fabricated with different steps and taper angles to measure the device characteristics, that is, with the step heights such as 10,000 Å, 5,000 Å and 3,000 Å and with the taper angle such as 40° and 20°. For each red light emitting display, the pixel defining layer is formed on the anode with 40° and 20° taper angles and with 10,000 Å, 5,000 Å and 3,000 Å step heights. After forming the pixel defining layer, poly(3,4-ethylene dioxythiophene (PEDOT), which is a polymer charge transporting layer, is formed in a thickness of 500 Å by a spin-coating process, and the annealing process is performed using a hot plate at 200° C. during 5 minutes.

Next, 4,4'-bis-[N-(1-naphthyl)-N-phenylamino]biphenyl (NPB), which is a monomer hole transporting layer, is formed in a thickness of 300 Å by a vacuum deposition method. Subsequently, the monomer R emission layer (the emission layer where 12% weigh fraction of TER004 is doped into TMM004 host) is patterned in a thickness of 300 Å by the laser induced thermal imaging process. Then, 50 Å thick bis(2-methyl-8-quinolinolato)(4-phenylphenylato)aluminum (BAlq) and 200 Å tris(8-quinolinolato)-aluminum (Alq3) are successively deposited as a hole blocking layer and a monomer electron transporting layer. Next, LiF/Al is deposited by a resistance heating process to form the cathode. And then, it is encapsulated by an encapsulating substrate using a sealant to fabricate the red light emitting display.

From Table 1, it will be appreciated that in case the step height between the anode and the pixel defining layer is large, the laser energy is increased due to the large step height, when the emission layer is patterned by the laser induced thermal imaging process. For this reason, it is shown that the organic emission layer has degraded characteristics and a reduced efficiency due to the laser energy, and the color coordinate is worsened due to the emission of the hole blocking layer or the electron transporting layer at the portion where the open defect of the edge of the emission region is generated.

Further, from Table 1, it will be appreciated that the red light emitting display without edge open defect and the degraded characteristics has color coordinates of 0.67, 0.33 and efficiency more than 5.0 Cd/A. The conditions that meet such device characteristics are a step height of 3,000 Å and a taper angle of not greater than 40°.

TABLE 1

| Step Height | Taper Angle (degree) | Laser Energy (J/cm$^2$) | Edge Open (µm) | Efficiency (Cd/A) | Color Coordinate |
|---|---|---|---|---|---|
| 10,000 Å | 40 | 1.5 | 5.0 | 1.5 | 0.58, 0.35 |
| 5,000 Å | 40 | 1.0 | 1.5 | 4.1 | 0.64, 0.34 |
| 3,000 Å | 40 | 0.7 | 0.5 | 5.3 | 0.67, 0.33 |
| 3,000 Å | 20 | 0.7 | 0 | 6.0 | 0.67, 0.33 |

Figure 8:
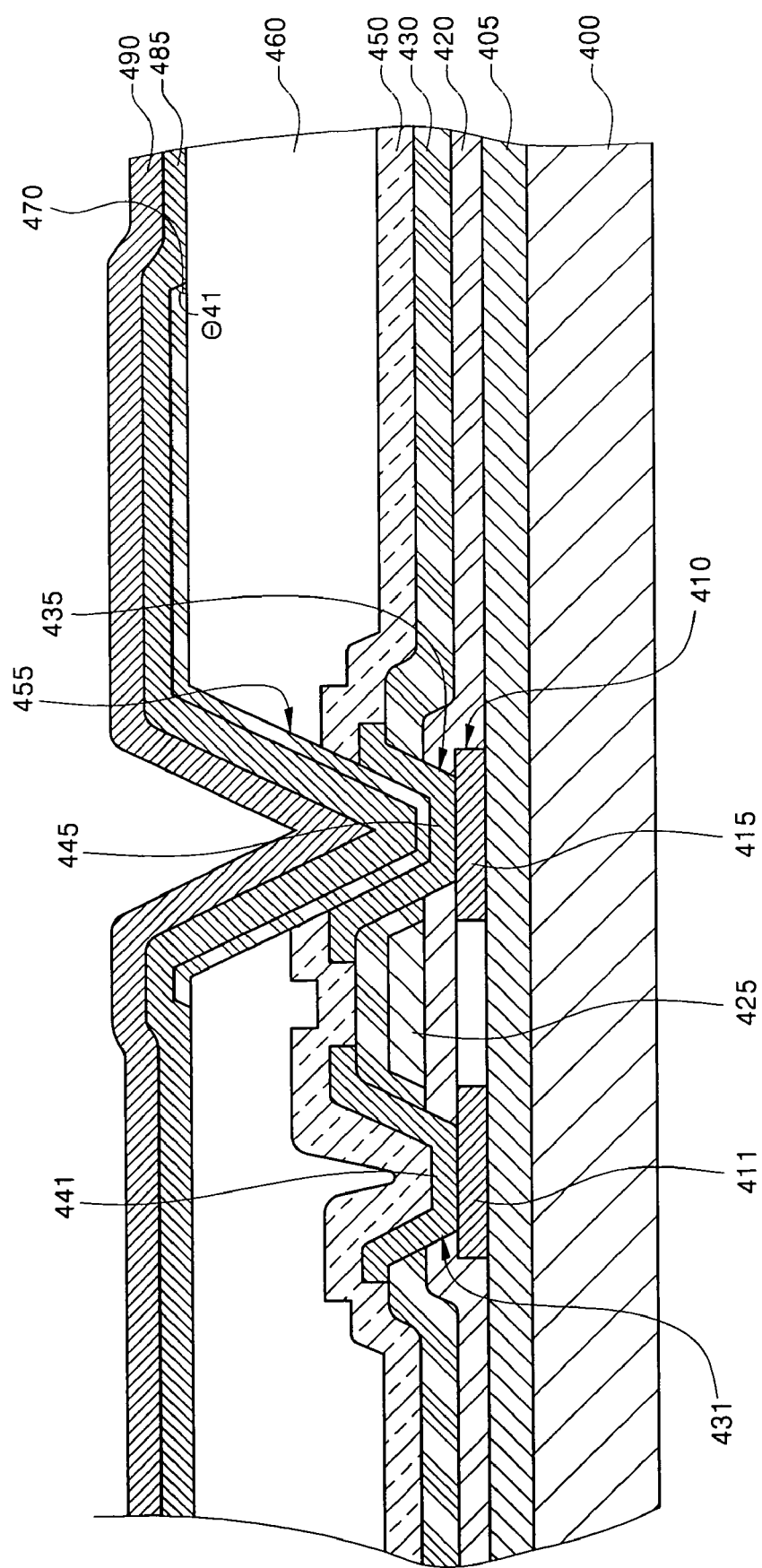
FIG. 8 is a cross-sectional view of an organic light emitting display according to a second embodiment of the present invention.

FIG. 8 is a cross-sectional view illustrating a top-emission organic light emitting display according to a second embodiment of the present invention. Referring to FIG. 8, a buffer layer 405 is formed on an insulating substrate 400, and a semiconductor layer 410 including source/drain regions 411, 415 are formed on the buffer layer 405. A gate electrode 425 is formed on a gate insulating layer 420, and source/drain electrodes connected to the source/drain regions 411, 415 are formed in an interlayer insulating layer 430 through first holes 431, 435.

A planarization layer 460 is formed on a passivation layer 450, and an anode 470, which is a lower electrode connected to one of the source/drain electrodes 441, 445, for example, the drain electrode 445 through a second hole 455, is formed in the planarization layer 460. An organic thin film layer 485 and a cathode 490 are formed on the TFT substrate. The organic thin film layer 485 includes at least an emission layer selected from a hole injection layer, a hole transporting layer, R, G, or B emitting layer, a hole blocking layer, an electron transporting layer and an electron injection layer. The organic thin film layer includes an organic emission layer formed by the laser induced thermal imaging process.

According to the present invention, in order to prevent open defect of the organic emission layer caused by the stepped region of the anode, which is a lower electrode, when the organic emission layer is formed by the laser induced thermal imaging process, it is desirable that the taper angle θ41 of the anode 470 is not greater than 40°.

Figure 9:
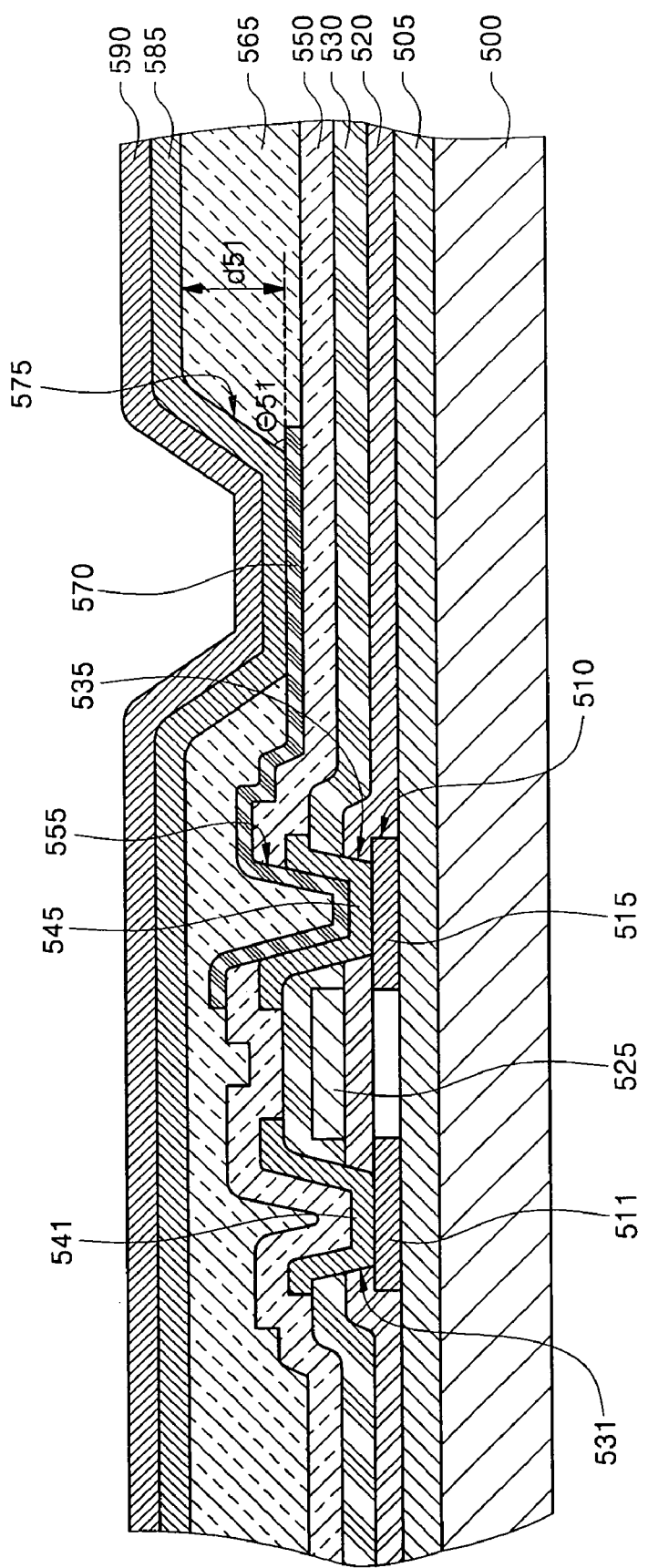
FIG. 9 is a cross-sectional view of an organic light emitting display according to a third embodiment of the present invention.

FIG. 9 is a cross-sectional view illustrating a bottom-emission organic light emitting display according to a third embodiment of the present invention. Referring to FIG. 9, a buffer layer 505 is formed on an insulating substrate 500, and a semiconductor layer 510 including source/drain regions 511, 515 are formed on the buffer layer 505. A gate electrode 525 is formed on a gate insulating layer 520, and source/drain electrodes 541, 545 is formed in an interlayer insulating layer 530 through first holes 531, 535.

An anode 570, which is a lower electrode connected to one of the source/drain electrodes 541, 545, for example, the drain electrode 545, through a second hole 555, is formed in a passivation layer 550. A pixel defining layer 565 including an opening 575 that exposes a portion of the anode 570 is formed, and an organic thin film layer and a cathode 590, an upper electrode, are formed on the pixel defining layer 565 and the anode 570 of the opening 575. The organic thin film layer 585 includes at least one organic layer selected from a hole injection layer, a hole transporting layer, R, G, or B emitting layer, a hole blocking layer, an electron transporting layer and an electron injection layer. The emission layer includes an organic thin film layer formed by a laser induced thermal imaging process.

According to the present invention, in order to prevent edge open defects at the opening edge of the pixel defining layer, and to prevent characteristic deterioration of the emission layer caused by high energy when the organic emission layer is formed by the laser induced thermal imaging process, it is desirable that a taper angle θ51 of the pixel defining layer 565 is not greater than 40°, and that a step height d51 from the upper surface of the anode 570, the lower electrode, to the upper surface of the pixel defining layer 565 is below or equal to about 3,000 Å.

Figure 10:
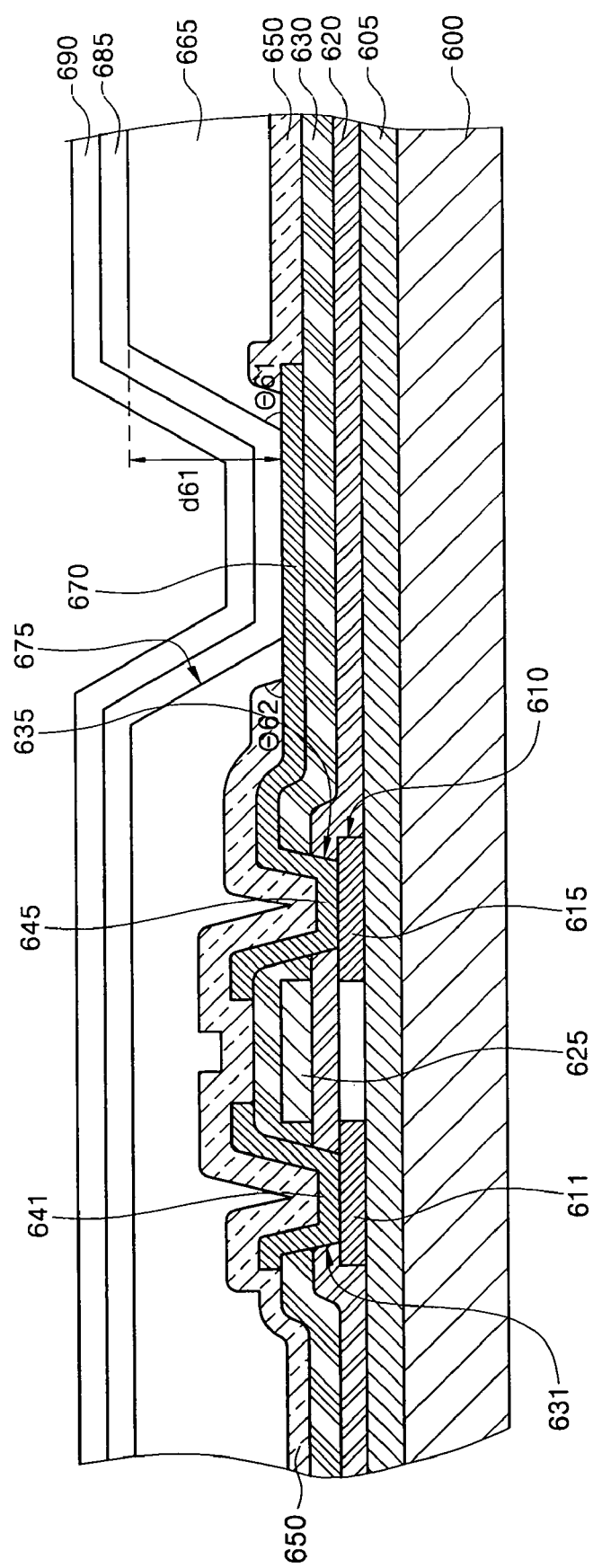
FIG. 10 is a cross-sectional view of an organic light emitting display according to a fourth embodiment of the present invention.

FIG. 10 is a cross-sectional view illustrating an organic light emitting display according to a fourth embodiment of the present invention. Referring to FIG. 10, a buffer layer 605 is formed on an insulating substrate 600, and a semiconductor layer 610 including source/drain regions 611, 615 are formed on the buffer layer 605. A gate electrode 625 is formed on a gate insulating layer 620, and source/drain electrodes 641, 645 connected to the source/drain regions 611, 615 through first holes 631, 635 are formed in an interlayer insulating layer 630. An anode 670 connected to one of the source/drain electrodes 641, 645, for example, the drain electrode 645, is formed in the interlayer insulating layer 630.

A passivation layer 650 including a first opening that exposes a first portion of the anode 670 is formed on the TFT substrate, and a pixel defining layer 665 including a second opening 675 that exposes a second portion of the anode 670 is formed on the passivation layer 650.

An organic thin film layer 685 and a cathode 690, which is an upper electrode, are formed on the pixel defining layer 665 and an anode 670 in the second opening 675. The organic thin film layer 685 includes at least one organic layer selected from a hole injection layer, a hole transporting layer, R, G or B emitting layer, a hole blocking layer, an electron transporting layer and an electron injection layer. The organic thin film layer is formed by a laser induced thermal imaging process.

According to the present invention, in order to prevent edge open defects at the second opening edge of the pixel defining layer, and to prevent characteristic deterioration of the emission layer caused by high energy when the organic emission layer is formed by the laser induced thermal imaging process, it is desirable that a second taper angle θ61 of the pixel defining layer 665 is not greater than 40°, and that a step height d61 from the upper surface of the anode 670, the lower electrode, to the upper surface of the pixel defining layer 665 is below or equal to about 3,000 Å.

According to the fourth embodiment of the present invention, the second opening 675 of the pixel defining layer 665 has the second taper angle θ61, and the first opening of the passivation layer 650 has a first taper angle θ62. Since the edge open defect depends on the second taper angle θ61 of the pixel defining layer 665 during a laser induced thermal imaging process, it is desirable that the pixel defining layer has the second taper angle θ61 of not greater than 40°. The first exposed portion of the anode 670 is within the second exposed portion of the anode 670.

The organic light emitting display according to the embodiment of the present invention can be applied to display devices having a bottom-emission structure, where the anode, or the lower electrode, is formed with a transparent electrode, and the cathode, or the upper electrode, is formed with a reflective electrode to emit light in a direction of the TFT substrate; a top-emission structure, where the anode, or the lower electrode, is formed with the reflective electrode, and the cathode is formed with the transparent electrode to emit light in a direction opposite to the TFT substrate; and a double-side-emission structure where the anode, or the lower electrode, and the cathode, or the upper electrode, are formed with the transparent electrodes to emit light both in the direction of the TFT substrate and in the direction opposite to the TFT substrate.

Further, although the embodiments of the present invention has been described with regard to the conventional organic light emitting display, in which the anode, the organic thin film layer and the cathode are sequentially stacked, it can be also applied to the inverted organic light emitting display, in which the cathode, the organic emission layer and the cathode are sequentially electrode.

According to the present invention as described above, an organic thin film for relieving a taper angle is formed on the anode, thereby preventing the defect around the first hole and the second hole as well as the defect of the organic emission layer, so that the reliability and yield can be enhanced.

Although the preferred embodiments of the present invention have been described, those skilled in the art will appreciate that a variety of modifications and changes can be made without departing from the idea and the scope of the present invention described in the following claims.

What is claimed is:

1. An organic light emitting display, comprising:
   a TFT substrate comprising an insulating substrate, a semiconductor layer having a source region and a drain region, a first insulating layer having holes that expose a portion of the source region and the drain region and a thin film transistor having a source electrode connected to the source region and a drain electrode connected to the drain region through the holes;
   a lower electrode formed on the first insulating layer and formed by extending one of the source electrode and the drain electrode;
   a second insulating layer having a first opening that exposes a first portion of the lower electrode;
   a third insulating layer having a second opening that exposes a second portion of the lower electrode, said second portion of the lower electrode being within the first portion of the lower electrode;
   an organic thin film layer formed on the third insulating layer and the second portion of the lower electrode; and
   an upper electrode formed on the organic thin film layer:
   wherein the third insulating layer has a taper angle not greater than 40° at an edge of the second opening, and a step height between the upper surface of the lower electrode at the second opening and the bottom surface of the organic thin film layer formed on the third insulating layer is less than or equal to 3,000 Å.

2. The organic light emitting display according to claim 1, wherein the second insulating layer is a passivation layer and the third insulating layer is a pixel defining layer.

3. The organic light emitting display according to claim 1, wherein the lower electrode is one of an anode and a cathode, and the upper electrode is the other one.

4. The organic light emitting display according to claim 1, wherein the lower electrode is a transparent electrode, and the upper electrode acts as a reflective or transparent electrode, and light emitted from the organic thin film layer is emitted in a direction of the TFT substrate or is emitted in both the direction of TFT substrate and a direction opposite to the TFT substrate.

5. The organic light emitting display according to claim 1, wherein the organic thin film layer includes at least one organic layer selected from the group consisting of a hole injection layer, a hole transporting layer, an emission layer, a hole blocking layer, an electron transporting layer and an electron injection layer, and the organic thin film layer includes an organic layer formed by a laser induced thermal imaging process.

\* \* \* \* \*